United States Patent [19]

Weber

[11] Patent Number: 5,808,896
[45] Date of Patent: Sep. 15, 1998

[54] METHOD AND SYSTEM FOR CREATING A NETLIST ALLOWING CURRENT MEASUREMENT THROUGH A SUB-CIRCUIT

[75] Inventor: Larren Gene Weber, Calwell, Id.

[73] Assignee: Micron Technology, Inc., Boise, Id.

[21] Appl. No.: 661,081

[22] Filed: Jun. 10, 1996

[51] Int. Cl.$^6$ ................................................. G06F 17/00
[52] U.S. Cl. ........................ 364/488; 364/489; 364/490; 364/491; 395/500
[58] Field of Search ................................. 364/488–491, 364/578; 395/701, 500

[56] References Cited

U.S. PATENT DOCUMENTS

| | | | |
|---|---|---|---|
| 5,301,318 | 4/1994 | Mittal ....................................... | 395/600 |
| 5,586,319 | 12/1996 | Bell ........................................ | 395/701 |
| 5,606,518 | 2/1997 | Fang et al. .............................. | 364/578 |

OTHER PUBLICATIONS

"DC and Transient Output Variables." *HSPICE User's Manual, vol. 3, Meta–Software, Inc.*, HSPICE Version H92, pp. 4–16—4–18, (1992).

"Probing Subcircuit Currents." *ADM User's Guide*, Version 1.5, ADS Software, Inc., pp. 4–5—4–7, (Feb. 1995).

Engel et al. "Splice: A New Analytical Network Analysis Software," IEEE, 1995, pp. 206.17–206.19.

Pavan et al. "A Complete Radiation Reliability Software Simulator," IEEE, 1994, pp. 2619–2630.

Harrington et al. "SPIL–A Program to Automatically Create ASIC Macro Models for Logic Simulation," IEEE, 1990, pp. PS–5.1–PS–5.4.

*Primary Examiner*—Emanuel Todd Voeltz
*Assistant Examiner*—Vuthe Siek
*Attorney, Agent, or Firm*—Schwegman, Lundberg, Woessner & Kluth, P.A.

[57] ABSTRACT

A system and method for manipulating a netlist, at the time that the netlist is being created, to permit measurement of current flow through a net, or combination of nets, of a sub-circuit during a subsequent simulation process, the manipulation of the netlist including identifying nets through which current flow is to be measured, creating "artificial" nets for the identified nets, substituting the "artificial" nets for the identified nets in the netlist file, and connecting a power supply between the artificial net and the identified net for which it has been substituted.

22 Claims, 10 Drawing Sheets

Netlist 402

| | |
|---|---|
| 4.1 | * Lines beginning with * are Comments |
| 4.2 | * Upper Level Nets are mapped |
| 4.3 | * ie vbb! becomes 3 |
| 4.4 | * A becomes 5 |
| 4.5 | * net 3 vbb! |
| 4.6 | * net 2 vpp! |
| 4.7 | * net 1 vcc! |
| 4.8 | * net 0 gnd! |
| 4.9 | * net 4 /OUT |
| 4.10 | * net 5 /A |
| 4.11 | * net 6 /net4 |
| 4.12 | * net 7 /net5 |
| 4.13 | |
| 4.14 | *Nets in instance I1 (load)are mapped |
| 4.15 | *net 9 /I1/netl4 |
| 4.16 | *net 10 /I1/net6 |
| 4.17 | |
| 4.18 | *Instances in load expanded |
| 4.19 | *cap(0) = /I1/C6 |
| 4.20 | C0 6 0 c = '1e-12' |
| 4.21 | *cap(1) = /I1/C5 |
| 4.22 | C1 7 0 c = '4e-12' |
| 4.23 | *resistor(2) = /I1/R3 |
| 4.24 | R2 10 6 R = '1e3' |
| 4.25 | *resistor(3) = /11/R2 |
| 4.26 | R3 9 7 R= '500.0' |
| 4.27 | |
| 4.28 | *Instances in inv GI1 in load expanded |
| 4.29 | *GI1 has property MeasI = inv1 vcc! |
| 4.30 | *nn(4) = /I1/GI1/MNA |
| 4.31 | M4 10 5 0 3 N l ='1.0' w ='10.0' |
| 4.32 | *pp(5) = /I1/GI1/MPA |
| 4.33 | *This instance would netlist out as |
| 4.34 | *M5 10 5 1 1 P l = '1.0' w ='20.0' |
| 4.35 | *except the MeasI property on GI1 causes |
| 4.36 | *all vcc! nets to be changed to invl_1 |
| 4.37 | M5 10 5 invl_1 invl_1 P l='1.0', w = '20.0' |

FIG. 4A

Netlist 402 (Con't)

4.38
4.39   *Instances in inv GI0 in load expanded
4.40   *GI0 has property MeasI = inv0 vcc!
4.41   *nn(6) = /11/GI0/MNA
4.42   M6 9 5 0 3  N l ='1.0' w ='10.0'
4.43   *pp(7) = /11/GI0/MPA
4.44   * This instance would netlist out as
4.45   *M7 9 5 1 1 P  l = '1.0'  w = '20.0'
4.56   *except the MeasI property on GI1 causes
4.47   *all vcc! nets to be changed to inv0_1
4.48   M7 9 5 inv0_1 inv0_1 P  l= '1.0' w = '20.0'
4.49
4.50   *Nets in instance GNA0(nand gate)in Top are mapped
4.51   *net 24 /GNA0/net456
4.52
4.53   *Instances in nand are expanded
4.54   *pp(8) = /GNA0/MPB
4.55   M8 4 6 1 1 P l = '1.0' w = '20.0'
4.56   *pp(9) = /GNA0/MPA
4.57   M9 4 7 1 1  P  l = '1.0'  w ='20.0'
4.58   *nn(10) = /GNA0/MNB
4.59   M10 24 6 0 3  N  l = '1.0'  w = '40.0'
4.60   *nn (11) = /GNA0/ MNA
4.61   M11 4 7 24 3 N  l = '1.0' w = '40.0'
4.62
4.63   * add MeasI Supplies:
4.64   vinv0_1 inv0_1 1 0
4.65   vinv1_1 inv1_1 1 0

FIG. 4B

```
1   /* ©Micron Technology, Inc. 1996 */
2   procedure ( MSfnIMeasCurrent ( terminals)
3     let ( ( ( measI MSfnISearchPropString( "MeasI" nil)) net wasNode isNode terms)
4       if( measI then
5         measI = parseString (measI)
6         unless ( measl = = _MS_FN_MEASI -> key   ; unless inside a new block.
7           _MS_FN_MEASI = list( nil)
8           foreach( node cdr(measI)
9             wasNode = fnlSigCdsNameExtName ( node)
10            unless( wasnode
13              MSsiErr ( "unable to find global net %s in %s\n"
12                        node
13                        fnICurrentInstCdsName()))
14            isNode = stcat(car(measI "_" wasNode)
15            unless( memq(concat (isNode) _MS_FN_SUPPLIES)
16              printf("NOTE: locally inserting supply:%s\n" isNode)
17              _MS_FN_SUPPLIES = cons ( isnode _MS_SUPPLIES)
18            )
19            putprop (_MS_FN_MEASI isNode concat ( wasNode)
20          )
21          _MS_FN_MEASI->key = measI
22        )
23        terms = tconc( nil nil)
24        foreach( net terminals
25          isNode = get( _MS_FN_MEASI concat( net))
26          if( isNode then
27            tconc( terms isNode)
28          else
29            tconc( terms net)
30          )
31        )
32        cdr(car (terms))
33      else
34        terminals
35      )
36   )
37 )
```

FIG. 8A

```
38
39  procedure( MSfnFooter()
40    when( _MS_FN_SUPPLIES
41      fnlPrInt("* Add MeasI Supplies:\n")
42      foreach( supply _MS_FN_SUPPLES
43        fnlPrint( "V")
44        fnlPrint( supply )
45        fnlPrint( " " )
46        fnlPrint( supply )
47        fnlPrint( " " )
48        fnlPrint( cadr (parseString( supply "_")))
49        fnlPrint( " 0\n")
50      )
51    )
52    t
53  )
54  /* ©Micron Technology, Inc. 1996 */
```

FIG. 8B

METHOD AND SYSTEM FOR CREATING A NETLIST ALLOWING CURRENT MEASUREMENT THROUGH A SUB-CIRCUIT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

FIELD OF THE INVENTION

The present invention relates to integrated circuits and in particular to the design, testing, and verification of integrated circuits.

BACKGROUND

Today's integrated circuits (ICs) may contain many circuit elements. Computer-aided design (CAD) and computer-aided engineering (CAE) tools are essential in producing these complicated integrated circuits. Circuit design can be represented by a schematic. Schematics consist of symbol instances connected by nets which demonstrate the functional design of the circuit. Symbol instances are pictorial icons that represent a complete functional block. Symbol instances can be primitive elements, such as transistors and resistors. Symbol instances can also be abstractions of combinations of primitive elements, such as NAND gates and NOR gates. Symbol instances can also be higher level groupings of these various elements.

To produce the complicated schematics of an integrated circuit, CAD software can be used. CAD software allows symbols to be saved in software libraries for use by all circuit designers within the entire IC. Portions of the IC can be easily replicated, deleted, and changed with the CAD software, forming a plurality of sub-circuits.

Another representation of a circuit design is the netlist. A netlist is a text file describing a circuit. The netlist lists all of the symbol instances and their connecting nets within a schematic. CAE software can be used to translate a schematic into a netlist. In a flat netlist, all of the higher levels of symbol instances are replaced by their primitive components. Thus, a schematic having multiple instances of NAND gates would result in a netlist having a collection of transistors.

A netlist is used as input to another CAE tool, the simulator. Simulators use netlists and input stimulus files to imitate the function of the circuit design without having to incorporate the design in hardware. Simulating a circuit by providing netlists and stimulus data is an efficient and cost worthy method of testing a circuit design to determine how the circuit performs prior to fabrication of the circuit as an integrated circuit structure. Circuit performance is determined by a function commonly referred to a probing, whereby currents and voltages are monitored at various points in the circuit design.

Processes have been proposed in the prior art for measuring current and/or voltages internally of sub-circuits of the circuit design. For example, META software available from Cadence Design Systems, Inc., San Jose, Calif., provides a way to measure current by adding a device for each node and then using arithmetic to add up all of the currents. Also, a simulator program, commercially available from ADM, provides a method for measuring current through a sub-circuit in a hierarchical netlist. However, neither one of these arrangements allows for the measurement of current in sub-circuits of a schematic through the application of a supply to the sub-circuits on a global basis for directly measuring current in sub-circuits during testing and verification of the circuit being designed.

SUMMARY OF THE INVENTION

The present invention provides a method and system for allowing the measurement of current in a sub-circuit of a schematic during simulation testing. The current measurement function is provided through the manipulation of a netlist of the schematic, as the netlist is being created, by interpreting instance properties to identify nets through which current flow is to be measured. "Artificial" nets are created and substituted for the nets specified by the instance properties, allowing the connection of a power source to specified nets of the instance.

In accordance with the invention, for each instance that includes a net, or combination of nets, through which current flow is to be measured, a property is assigned to the instance on the schematic, the property identifying the net and the power supply to be connected to the net. A flat netlister formatter provided by the invention is interfaced with a conventional flat netlisting engine, whereby, as the flat netlisting engine creates a flat netlist from the schematic, procedures of the flat netlister formatter interpret each property, replace each net identified by the property with an artificial net, and declare the power supply to be connected between the artificial net and the net originally called out, to allow current flow through the net to be measured during a subsequent simulation.

BRIEF DESCRIPTION OF THE DRAWINGS

FIGS. 4A and 4B are a flat netlist created by a flat netlister program and the present invention, the measure current net engine, corresponding to the bottom schematic of FIG. 3A including artificial nets;

FIGS. 8A and 8B are an exemplary listing of code for creating artificial nets in the procedure of FIG. 7.

DESCRIPTION OF THE PREFERRED EMBODIMENT

In the following description, reference is made to the accompanying drawings which form a part hereof and in which is shown by way of illustration a specific embodiment in which the invention may be practiced. This embodiment is described in sufficient detail to enable those skilled in the art to practice and to use the invention, and it is to be understood that other embodiments may be utilized and that changes may be made without departing from the spirit and scope of the present invention. The following description is, therefore, not to be taken in a limiting sense and the scope of the invention is defined by the appended claims. In the figures, elements having the same number perform essentially the same functions.

Schematic

Figure 1:
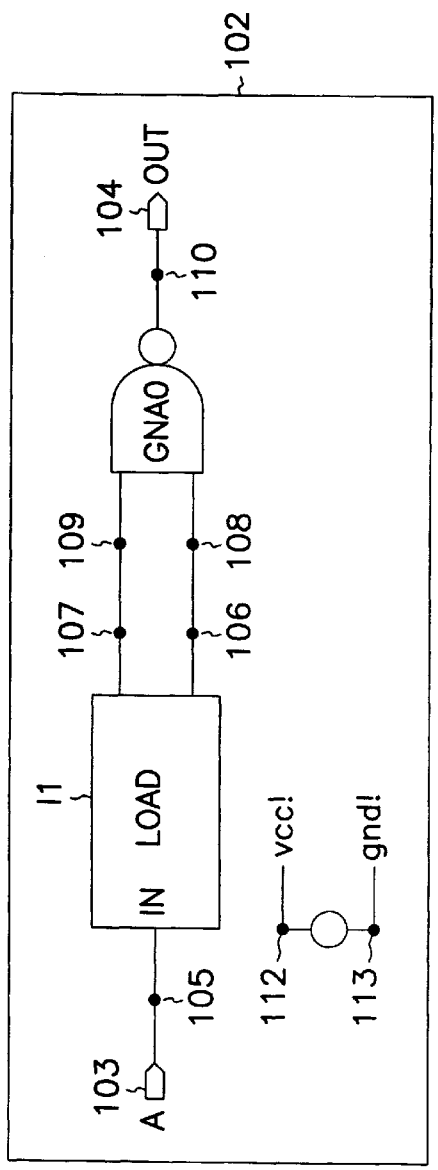
FIG. 1 is a top schematic including an instance "load" and an instance of a NAND gate.

The invention is described with reference to an application to a sub-circuit or cell of a schematic 102 in FIG. 1. The sub-circuit includes an instance 11 of a circuit called "load" and an instance GNA0 of a NAND gate. Such schematic 102 can be created by a computer-aided engineering (CAE) tool or schematic design tool. One such CAE tool is Design Entry available from Cadence Design Systems, Inc., San Jose, Calif.

The sub-circuit has an input node or net 103 labeled "A" and an output node or net 104 labeled "OUT". The Instance I1 includes an input net 105 which is connected to input net 103, an output net 106, and output net 107. Instance GNAO includes input nets 108 and 109 which are connected to nets 106 and 107, respectively, and an output net 110 which is connected to output net 104.

Instances I1 and GNAO also have a net 112, which is labeled vcc!, and a net 113, which is labeled gnd!, by which the power supply is provided to the instances. Conventionally, the power supply is carried throughout the circuit diagramed by the schematic 102 by global nets which are customarily denoted as vcc! and gnd!. The "!" character in the net name indicates that the net is global to the entire schematic.

Figure 2:
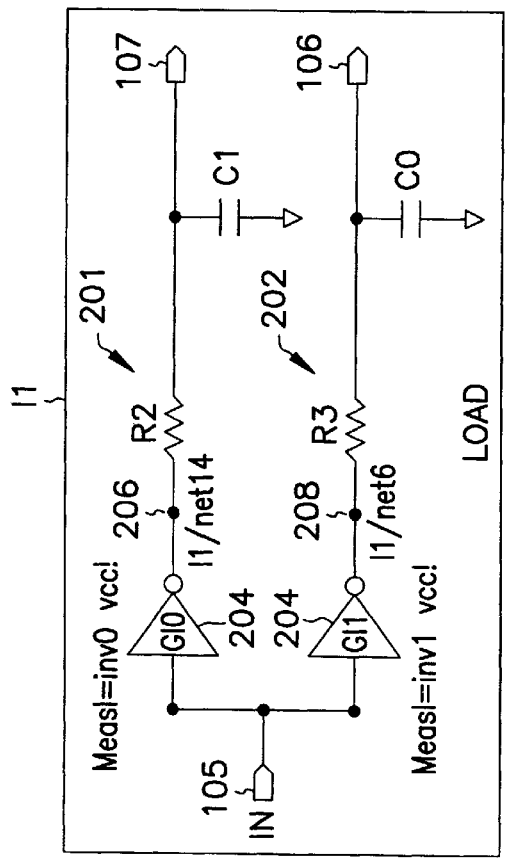
FIG. 2 is a lower-level schematic of the instance "load" of FIG. 1.

FIG. 2 is the next lower level representation of instance I1 of schematic 102. In FIG. 2, instance I1 is revealed to include two parallel circuit paths 201 and 202, each of the circuit paths including an inverter, a resistor and a capacitor. Thus, circuit path 201 includes a first instance GI0 of an inverter 204, a resistor R2 and a capacitor C1. Instance GI0 of the inverter has an input connected to input net 105 and an output 206 that is labeled I1/net 14. Resistor R2 is connected between the output 206 and the output net 107. Capacitor C1 is connected between the output net 107 and ground. Circuit path 202 includes a second instance GI1 of inverter 204, a resistor R3 and a capacitor CO. Instance GI1 of the inverter has an input connected to input net 105 and an output 208 that is labeled I1/net 6. Resistor R3 is connected between output 208 and the output net 106. Capacitor C1 is connected between the output net 106 and ground.

The present invention allows "artificial" nets or ports to be created in specific sub-circuits of a schematic, such as schematic 102. In accordance with the present invention, the creation of such "artificial" nets or ports is accomplished by the use of "property lists". Property lists are data structures supported by Design Entry and other CAD software systems. A property list for an instance symbol or net consists of a property name and a value to be associated with the property name. In the exemplary embodiment, each of the instances GI0 and GI1 of inverter 204 has a property "MeasI" which is indicated at the instance. In the example, the property MeasI of these instances has a property value of "inv0 vcc!" for instance GI0 and a property value of "inv1 vcc!" for instance GI1. The present invention achieves the creation of local artificial nets through the creation of this "MeasI" Property list. In the exemplary embodiment, the artificial nets allow measuring of current flow within the instances GI0 and GI1, by causing a "local" power supply to be inserted between the existing power supply inputs as will be described. However, the property MeasI allows the circuit designer to specify which nodes or nets of the instance through which current flow is to be measured, and the nets that can be specified by this property are not limited to supply nets such as nets 112 and 113 to which are applied vcc! and gnd!, but can be other nets of the instance. Also, the property MeasI can indicate a plurality of nets through which current flow is to be measured. For example, the property MeasI can have a property value of "inv0 vcc! gnd! 206, in which case current flow will be measured through the net 112 which is connected to vcc!, the net 113 which is connected to gnd!, and the net 206 (which is assigned the net name I1/net 14 by a flat netlisting traversal engine) between the output of instance GI0 of the inverter and resistor R2.

The MeasI property list allows mapping of the nets of schematics, such as schematic 102. This property list allows the circuit designer to map a global net, such as vcc!, to a local artificial net that is contained within a block of the schematic 102. In the exemplary embodiment, the MeasI property list states that in instance GI0, the global net vcc! is mapped to a local artificial net "inv0 vcc!", and in instance GI1, the global net vcc! is mapped to a local artificial net "inv1 vcc!". Such mappings indicate that whenever the global net vcc! is referenced within an instance, a "local" power supply should be connected into the circuit.

A new, or "artificial" net (identified as "supply_net") is created in the netlist for each of the nets in the MeasI property. In the exemplary embodiment, two "artificial" nets are created in the netlist, and these nets are identified as "inv1_1" and "inv0_1". Net "inv1_1" is located in the instance GI1 of the inverter 204 as indicated by string portion "inv1", which is the supply name. The net through which current is to be measured through, is a net to which vcc! is applied as indicated by string portion "_1". As will be shown, the "vcc!" net 112 is given the net number "1" in a flat netlist that is created from the schematic 102. During the creation of the flat netlist, these "artificial" nets are swapped, or substituted for the nets called out. These new "artificial" nets are global to the netlist. To complete the task of manipulating the netlist to allow current flow through the "vcc!" to be measured, a voltage source is inserted between the new net and the original net in the last step of the procedure when artificial nets have been substituted for nets called out.

Figure 3A:
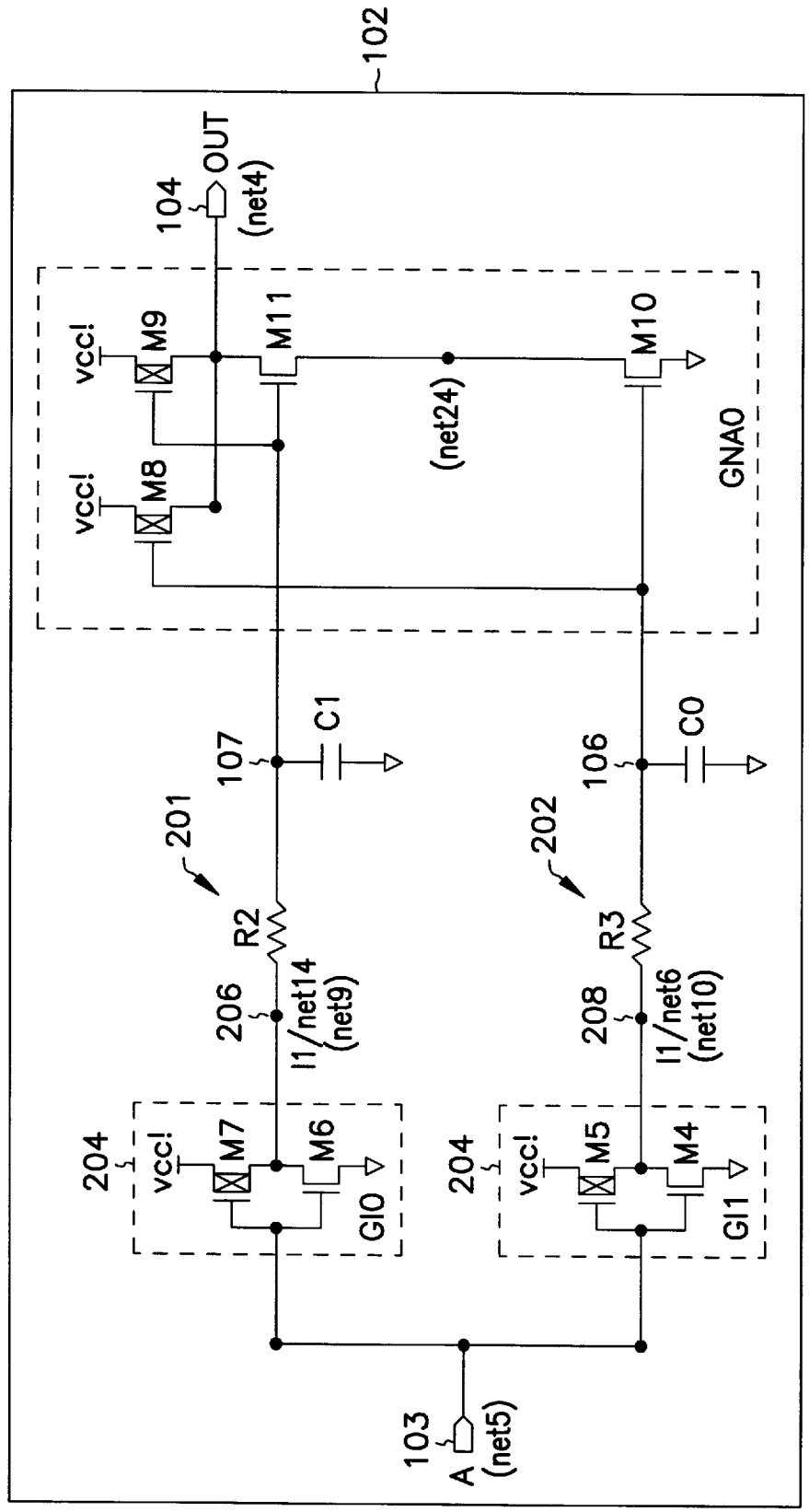
FIG. 3A is a bottom schematic of the instance "load" and NAND gate of FIG. 1.

Referring now to FIG. 3A, there is illustrated a bottom level schematic of schematic 102. In FIG. 3A, the two instances GI0 and GI1 of the inverter 204 are shown as their elementary pair of p-type and n-type transistors. For example, instance GI1 includes n-channel transistor M4 and p-channel transistor MS. Similarly, instance GI0 includes n-channel transistor M6 and p-channel transistor M7.

Also in FIG. 3A, a bottom level schematic of the instance GNA0 of the NAND gate is provided. Instance GNA0 includes p-channel transistors M8 and M9 and n-channel transistors M10 and M11. The NAND gate is conventional and accordingly is not described in detail. The gates of M8 and M10 are commonly connected to net 106. The gates of M9 and M11 are commonly connected to net 107. The sources of M8 and M9 are connected to vcc! The drains of M8 and M9 are commonly connected to net 104. The junction of the drain of M10 and the source of M11 define a net 24.

Figure 3B:
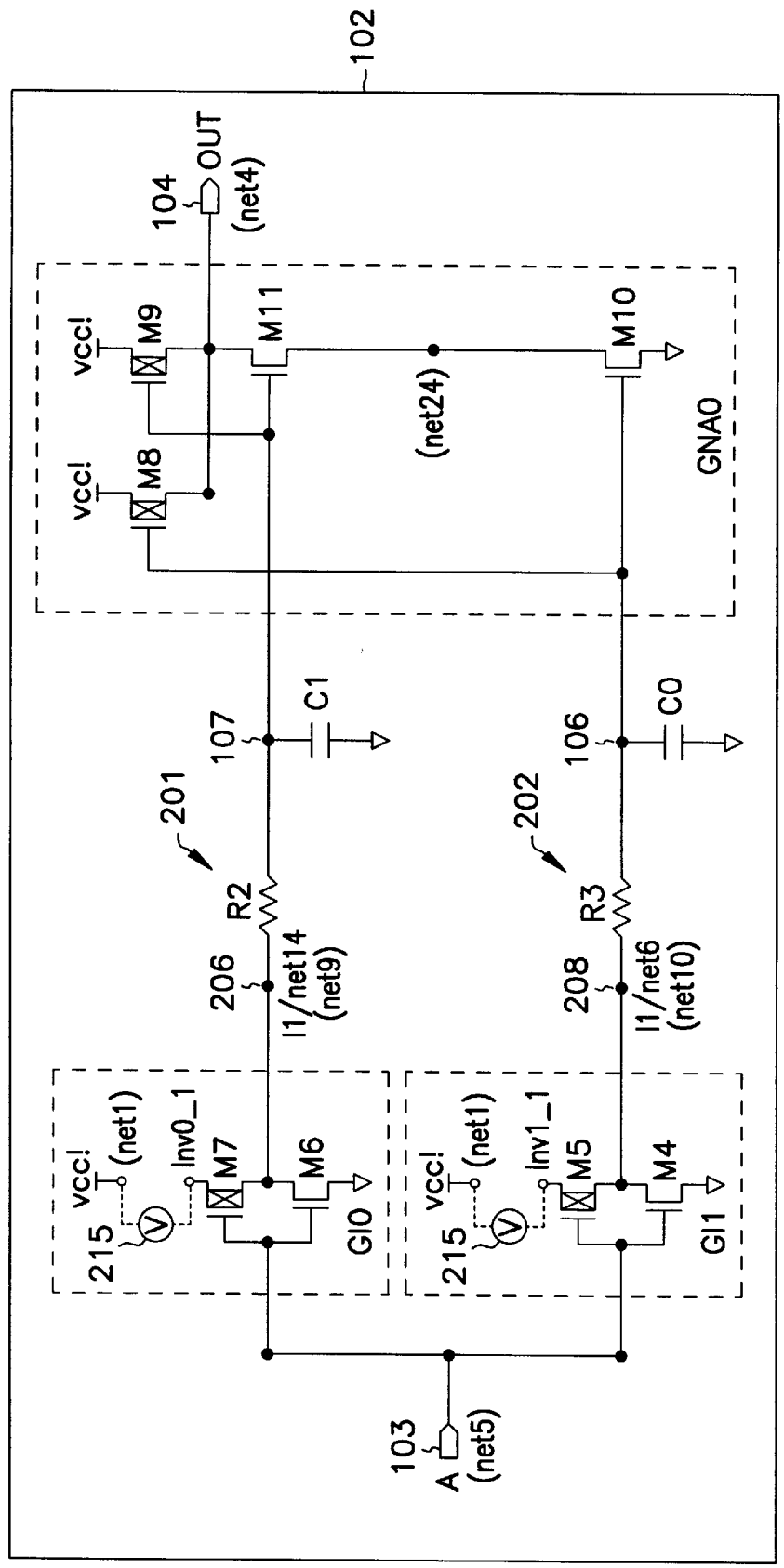
FIG. 3B is a bottom schematic similar to that of FIG. 3A and showing artificial nets substituted for the power supply net vcc! in accordance with the invention.

Note that in FIG. 3A, the power supply is finally integrated as a part of schematic 102. In FIG. 3A, the power supply vcc! is routed to the transistor pairs of the two instances GI0 and GI1. In a traditional schematic, the power supply would be available through the global net vcc!. The present invention, however, allows an artificial local net to be substituted for the global vcc! net. Referring to FIG. 3B, in instance GI0, the local artificial net inv0_1 is substituted for net 1 (vcc!). Similarly, in instance GI1, the local artificial net inv1_1 is substituted for net 1 (vcc!). This substitution is accomplished through the entry of the MeasI property list at the higher level of schematic 102 in the sub-circuit "load" shown in FIG. 2, to identify each net in each instance through which current is to be measured.

To be useful to a simulator software package, schematic 102, must be translated into a textual file. This translation is done by a translation program, called a netlister. There are two types of netlisters. A flat netlister traversal engine creates a netlist showing the primitive elements of schematic 102. The netlist of FIGS. 4A and 4B are a flat netlist 402. A hierarchical netlist includes definitions of higher level blocks of schematic 102, such as the definition of instance I1, and/or GNA0 in FIG. 1. In one embodiment, the netlister used to produce a flat netlist is the tool Flat Netlister (FNL). The skeleton program of the FNL flat netlisting tool is provided by Cadence Design Systems, Inc., San Jose, Calif. as part of their "Open Simulation System" environment. Other netlisters can be used. The FNL flat netlisting tool available from Cadence Design Systems, Inc., allows the easy integration of client-written subroutines to perform output formatting. In one embodiment of the invention, the process for manipulating the netlist to permit current measurement through nets of instances of a schematic during simulation, is implemented as a set of these interfaced subroutines to the FNL flat netlisting tool.

Flat Netlist

The flat netlist 402 of FIGS. 4A and 4B is a representation of the instances and nets necessary to describe the schematic 102 to the HSPICE simulator. In the exemplary embodiment, the flat netlist 402 is produced from the schematic using the skeleton program of the FNL flat netlisting tool. However, other netlisters could be used.

The netlist is a textual coded description of all primitive elements in schematic 102 and how these elements are connected by nets. The flat netlist 402 describes the instances and nets specified in a design in a format that is useable by a simulator. In schematic 102, instances and nets can be referenced with string names or not referenced at all. The FNL flat netlisting tool, however, assigns each instance and net a distinct reference number.

Each line of the flat netlist 402 in FIGS. 4A and 4B has a number from 1 to 65 preceded by "4.", for correspondence to FIGS. 4A and 4B. The following description is correlated with the line numbers for each line in FIGS. 4A and 4B. In this embodiment of a netlist, all comments begin with an asterisk (*).

In FIGS. 4A and 4B, the global net vcc! is assigned net number 1, or net 1. This fact is noted in the comment line at line 4.7. Similarly, the global net gnd!, or ground, is assigned net number 0 as noted in line 4.8. In addition, the nets 106 and 107 of the circuit "load" which correspond to net4 and net5, respectively, are mapped to net 6 and net 7 as noted in lines 4.11 and 4.12. Also, as noted in lines 4.15 and 4.16, certain nets in instance I1 (circuit "load") are mapped as net 9, which corresponds to I1/net 14, and as net 10, which corresponds to I1/net6.

The instances of the resistors and capacitors in the circuit "load" (FIG. 2) are described in lines 4.18 to 4.26. Lines 4.20 and 4.22 declare capacitors C0 and C1 of schematic 102. Capacitor definitions are noted with the initial letter "C". In line 4.20, capacitor C0 is said to be connected between net 6 (net4 in FIG. 2) and net 0 (ground) and to have a value of 1e-12, or 1 picofarad. In line 4.22, capacitor C1 is said to be connected between net 7 (net5) and net 0 (ground) and to have a value of 4e-12, or 4 picofarads.

The resistor R2 is declared in line 4.24 as being connected between net 10 (I1/net6) and net 6 (net4) and having a value of "1e3" or 1000 ohms. Resistor R3 is declared in line 4.26 as being connected between net 9 (I1/net 14) and net 7 (net5) and having a value of 500 ohms.

Lines 4.28 to 4.37 define the transistors I1/GI1/MNA and I1/GI1/MPA of instance GI1. For example, line 4.31 states that transistor I1/GI1/MNA, identified as M4 in line 4.31, is of an n-type mosfet, having its drain connected to net 10 (I1/net6 in FIG. 3A), its gate connected to net 5 (net6 in FIG. 3A), its source connected to net 0 (gnd!), and its substrate connected to net 3 (vbb!). In a conventional netlist, the instance of transistor I1/GI1/MPA would be declared as stated in line 4.34, which is indicated as a comment line. That is, the instance, identified as M5 in line 4.34, is of a p-type mosfet, having its drain connected to net 10 (I1/net 6 in FIG. 3A), and its gate connected to net 5 (net6 in FIG. 3A). A conventional netlist would state that the source of the transistor M5 is connected to net 1 (vcc!), and the substrate of the transistor M5 is connected to net 1 (vcc!), in the manner stated in comment line 4.34.

Transistors I1/GI0/MNA and I1/GI0/MPA of instance GI0 are defined in a similar manner in lines 4.39 to 4.48. Again, a conventional netlist, would declare the source of the transistor M7 being is connected to net 1 (vcc!), and the substrate being connected to net 1 (vcc!) as stated in comment line 4.45.

Digressing, in accordance with the invention, the flat netlist 402 of FIGS. 4A and 4B includes the "artificial" local nets inv1_1 in line 4.37 and inv0_1 in line 4.48 that are supported by the present invention and are illustrated in FIG. 3B. Lines 4.33 to 4.36 have been added to the netlist by the present invention as comment lines to indicate that the MeasI property on instance GI1 causes all vcc! nets to be changed to inv1_1. Similarly, lines 4.44 to 4.47 have been added by the present invention as comment lines to indicate that the MeasI property on instance GI0 causes all vcc! nets to be changed to inv0_1.

Thus, in line 4.37, which describes the p-type mosfet in instance GI1, the two occurrences of vcc! (net 1) have been replaced by the artificial net inv1_1. Also, in line 4.48, which describes the p-type mosfet in instance GI0, the two instances of vcc! (net 1) have been replaced by the artificial net inv0_1.

Continuing with the description of the netlist 402, lines 4.53 to 4.61 declare the p-channel transistors GNA0/MPB, GNA0/MPA, and the n-channel transistors GNA0/MNB and GNA0/MNA of instance GNA0 of the NAND gate. For example, line 4.55 declares, in the conventional manner, that transistor GNA0/MPB, identified as M8 in line 4.55 (and in FIG. 3A), is a p-type mosfet, having its drain connected to net 4 (output 104), its gate connected to net 6 (net 106 in FIG. 3A), its source connected to net 1 (vcc!), and its substrate connected to net 1 (vcc!), as indicated by the series of numbers "4 6 1 1" that follow the designation M7. Transistors M9 (GNA0/MPA), M10 (GNA0/MPB) and M11 (GNA0/MNA) are defined in a similar manner in respective lines 4.57, 4.59 and 4.61, with transistors M10 and M11 being n-channel transistors.

In accordance with the invention, voltage sources 215 have been declared in lines 4.64 and 4.65. For example, line 4.64 declares that a supply "vinv0_1" is connected between the artificial net "inv0_1" and the net having the net number "1" (vcc!). The supply is said to provide 0 volts as represented by the number "0". Similarly, line 4.65 declares a supply "vinv1_1" connected between the artificial net "inv1_1" and net 1 (vcc!). The supply provides 0 volts as represented by the number "0" in line 4.65. Referring to FIG. 3B, the connection of the voltage sources 215 (which correspond to "vinv1_1" and "vinv0_1") between vcc! and the source of the transistor M5, and between vcc! and the source of the transistor M7, are represented by the dashed lines.

Computer System

Figure 5:
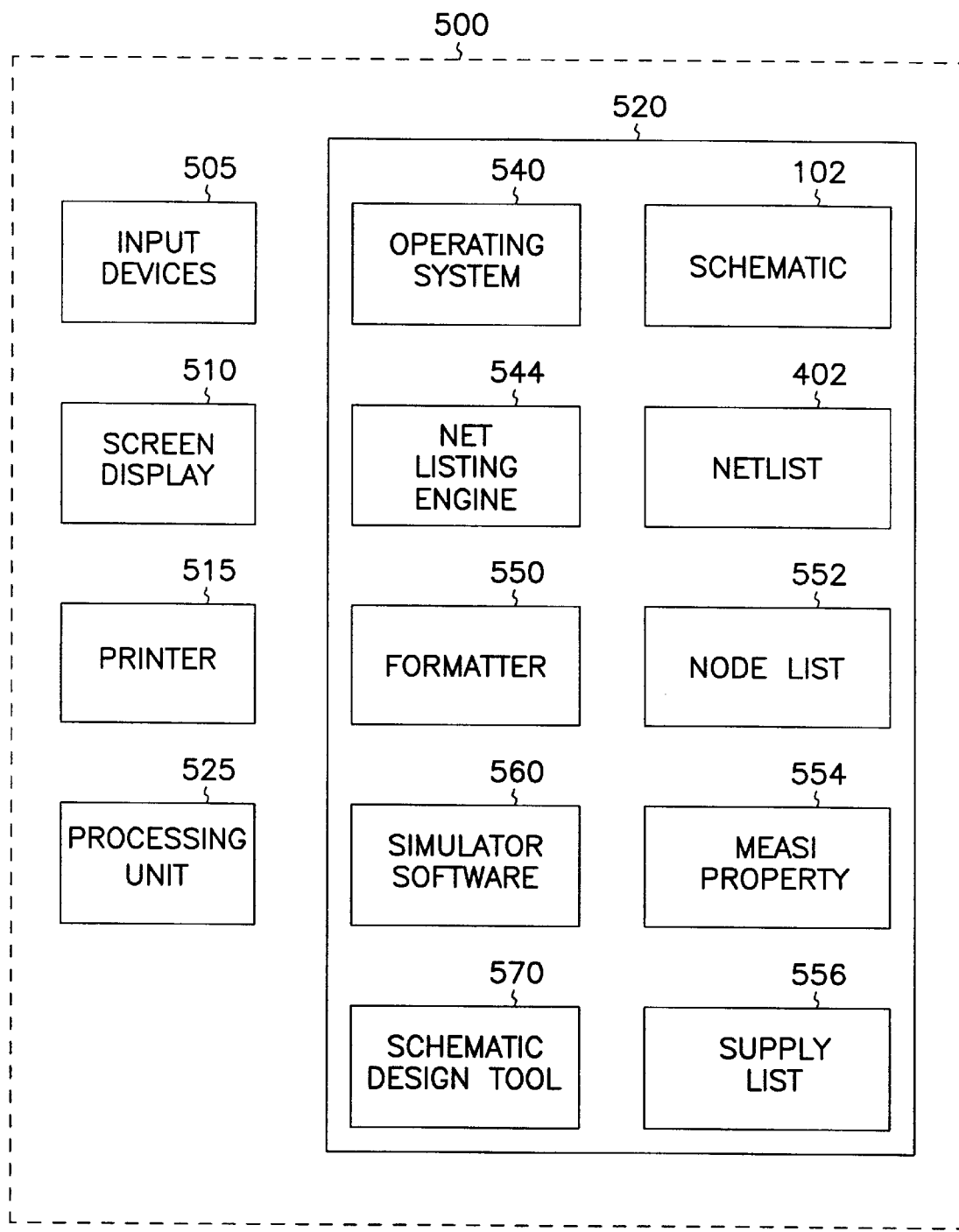
FIG. 5 is a block diagram of a computer system for creating schematic designs and for building flat netlists.

FIG. 5 is a block diagram of a computer system 500 in which the present invention is capable of being executed. The computer system includes input devices 505, such as a keyboard, mouse or digital drawing pad, a display unit with a screen 510, a printer or plotter 515, storage devices 520, and a processing unit 525. Computer system 500 can be a Sun workstation available from Sun Microsystems in Palo Alto, Calif. The workstation is connected to a local area network which provides connection to suitable storage devices which are represented by block 520.

The storage devices 520 include programs and files of the computer system 500 which are used in the schematic design, the netlist creation and simulation of the circuit. The programs and files of the computer system include an operating system 540, a flat netlister traversal engine 544, a flat netlist formatter 550, a "Node" list 552, a "MeasI Property" list 554 (_MS_FN_MEASI), a "Supply" list 556 (_MS_FN_SUPPLIES), simulator software 560, a schematic design tool 570, the schematic 102, and the flat netlist 402.

Flat Netlister Traversal Engine

Figure 6:
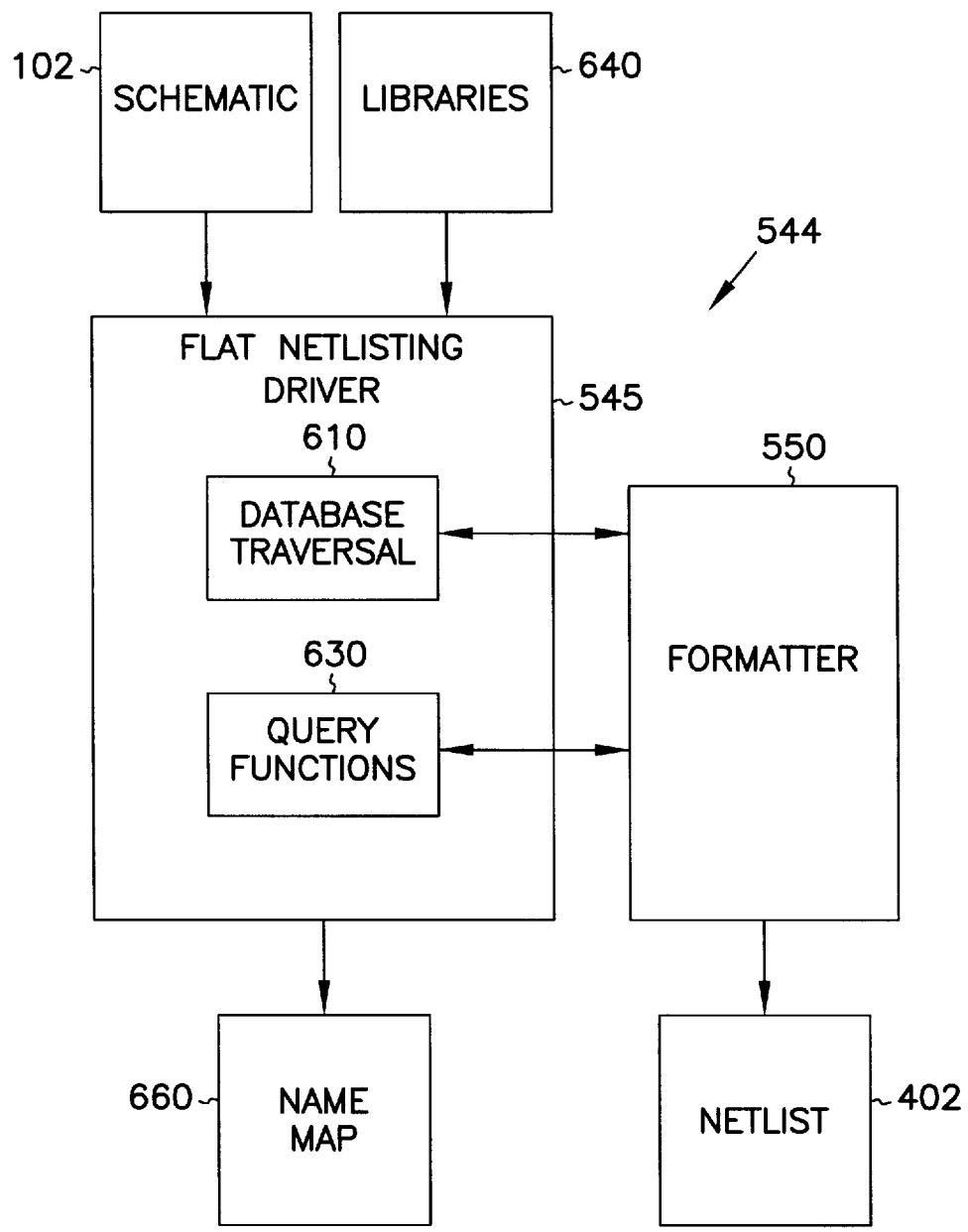
FIG. 6 is a block diagram showing a conventional flat netlister traversal engine and the flat netlist formatter provided by the invention.

FIG. 6 is a block diagram illustrating a flat netlister traversal engine 544 which includes a conventional flat netlisting driver 545 and a flat netlist formatter 550 provided by the invention for producing the flat netlist 402 in accordance with the invention. The flat netlisting driver 545 includes a database traversal block 610 and query functions 630. The database traversal block 610 walks through the designed schematic's hierarchy of symbol instances and nets to determine the primitive devices for each instance on the schematic 102 and converts the symbol instances from schematic 102 into the appropriate text string of netlist 402. The flat netlisting driver 545 reads libraries 640 to allow the flat netlisting driver to define the most primitive level for the devices that comprise each instance on the schematic. The query functions 630 are used in the creation of the flat netlist 402.

The flat netlist formatter 550 provides user-supplied functions for use by the flat netlisting driver 545 in creating flat netlists, such as flat netlist 402, with "artificial" nets in accordance with the invention. In this example, these user-supplied functions are called by a function "NLPCompleteElementString" of the flat netlisting driver 545. The flat netlisting driver produces a name map 660 which is a data structure which aids in post-simulation highlighting within a schematic as is known in the art. The data structure 660 associates the net names of the artificial nets with the net names of the called out nets that the artificial nets replace.

The flat netlisting driver 545 and the flat netlist formatter 550 comprise software programs residing in computer system 500 or any other suitable media or computer program product which is capable of providing a computer readable program code. In one embodiment, flat netlisting driver 545 and the user-supplied functions which comprise the flat netlist formatter 550 can be written in SKILL code, a computer language provided by Cadence Design Systems, Inc., San Jose, Calif. In other embodiments, other computer languages, such as C++, Pascal, and SmallTalk computer languages could be used as well.

Netlist Creation

The following description illustrates the implementation of the invention in creating the flat netlist 402 from the schematic 102, FIG. 2, on which an instance, such as instance GI0 of inverter 204, has the MeasI property value "inv0 vcc!". The implementation discussed herein therefore describe the code to generate the proper simulator-specific netlist representation for the HSPICE simulator available from MetaSoft. Though other simulators can be supported, their netlist representations are variations of the simulator referenced herein. The completed flat netlist can be fed as an input to a simulator in step for simulation purposes.

Figure 7:
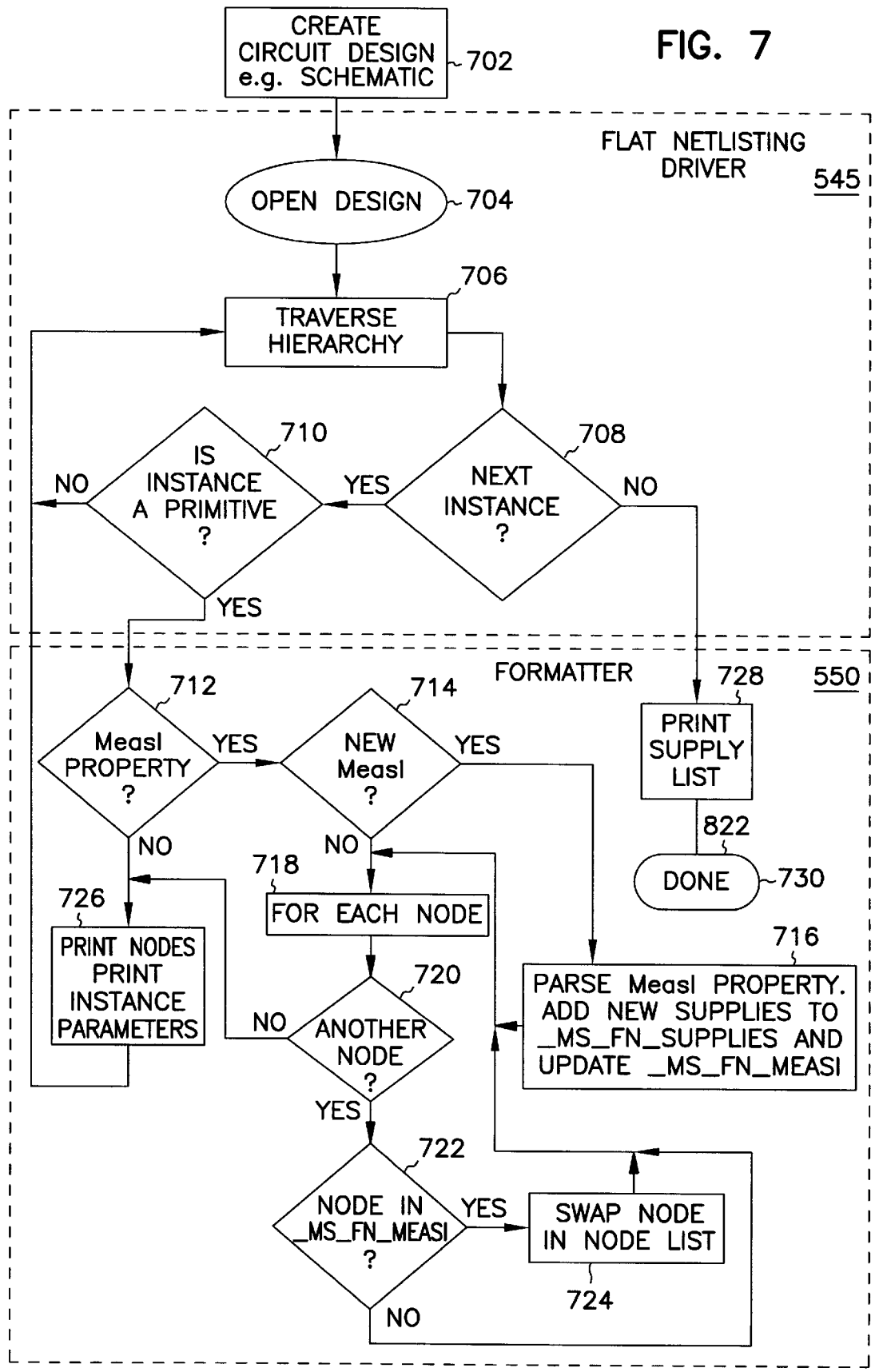
FIG. 7 is a flow chart illustrating the steps taken by the flat netlisting driver and the flat netlist formatter in the creation of a flat netlist that is adapted to permit measurement of current through a net of an instance.

For the flat netlister, the software evaluates all hierarchical parameters and delivers the information as if the design were flat. Thus, the properties on each instance are immediately available. The process of circuit designing and netlisting is abbreviated in the flowchart of FIG. 7. FIG. 7 illustrates the processing done by the flat netlister traversal engine 544, including the conventional flat netlisting driver 545 (FIG. 6) and the flat netlist formatter 550, provided by the invention, in the creation of the flat netlist 402.

Referring to FIG. 7, along with FIGS. 3B, 5 and 6, at step 702, the schematic 102 is created using the schematic design tool 570 and stored in the schematic data file 102 (FIG. 5). At step 704, flat netlisting driver 545 opens the file for schematic 102 and step 706 traverses the hierarchy of the schematic 102. Step 708 locates each instance of each device on the schematic in sequence.

Step 710 determines whether or not the current instance is a primitive device. If the current instance is not a primitive device, the procedure returns to step 706 and resumes traversing of the hierarchy to locate the next instance. When a primitive instance of a device, such as MPA (i.e., M5) of instance GI1 of "inv", for example, is found at step 710, a function "NLPCompleteElementString" of the flat netlisting driver 545 passes control to the flat netlist formatter 550 for executing user-provided functions.

At step 712, the flat netlist formatter 550 determines if the current instance includes the MeasI property. If so, as in the case of instance MPA of "inv" GI1 which "inv" has the property "Meas1=inv1 vcc!", step 714 determines if the particulars of the property for this instance have been placed in the MeasI Property list 554. If not, step 716 updates the list MeasI Property 554, first parsing the MeasI property to obtain the supply name and the net name of each of the net, or nets, identified by the property. The supply name is added to the Supply list 556 and the MeasI Property list 554 is updated to add the property for the current instance. In the case of the MeasI property assigned to instance GI1 of inverter 204, the property value is "inv1 vcc!". The net names of the artificial nets added to the MeasI Property file and can be associated in a map with the net names of the called out nets for each instance. The map can be a look-up structure that is part of the MeasI Property file or a separate look-up structure.

The procedure continues to steps 718–720, where for each net of the current instance, the MeasI Property list 554 is read to determine if the net is listed in the MeasI Property list 554. If so, step 724 causes the net to be swapped in the Node list 552 for the net called out, so that the artificial net will be printed in place of the net called out. In the example, net inv1__1 is created and is substituted for net 1 (vcc!), the net that is connected to the source of instance MPA.

The procedure returns to steps 718–720 to process the next node because instance MPA has four nets. The instance MPA has a second net that is contained in the MeasI Property list 554, namely, the net by which substrate bias is applied to instance MPA. Accordingly, "artificial" net inv1__1 is swapped for this net in the Node list 552. The other two nets of instance GI1, namely net 10 (I1/net6) and net 5(A), are not contained in the Measl Prop list 554, and so these nets are not modified and are added to the netlist file unchanged. See, for example, line 4.37 of the flat netlist 402 of FIGS. 4A and 4B, in which inv1__1 has been substituted for both of the occurrences of "net 1" (vcc!) in the instance GI1 of the "inv", but net numbers 10 and 5 are printed in the netlist. When all four nets of the instance MPA have been processed, from step 720, the process flows to step 726 which prints the nodes and the device parameters of the current instance to the netlist file. Step 726 then returns control to the flat netlisting driver to locate the next instance. A similar procedure is followed for instance of device MNA of instance GI1 of "inv". However, none of the four nets of device MNA of instance GI1 is listed in the MeasI Property list 554 and so the four nets are added to the netlist file unchanged. See, for example, line 4.31 of the flat netlist 402 of FIGS. 4A and 4B.

A similar procedure is followed for the instances of primitive devices MPA and MNA of instance GI0 of "inv" to create the artificial net inv0__1 and swap this net for the net 1 (vcc!) the netlist. See for example, line 4.48 for instance MPA (and line 4.42 for instance MNA) An example of a segment of code for the procedure for creating artificial nets and substituting the artificial nets for the nets included in the MeasI property is shown in FIG. 8A, lines 2–37.

If step 712 determines that the current instance does not have the MeasI property, such as in the case of the four primitive devices MPB, MPA, MNB and MNA of the instance GNA0 of NAND gate, the nets are not modified. Thus, for the instance of GNA0 of NAND gate, step 726 prints the nets (unmodified) and the devices of the this instance to the netlist file 402. See, for example, lines 4.55, 4.57, 4.59 and 4.61 of the flat netlist 402 of FIGS. 4A and 4B, which describe the nets for four transistors of the instance GNA0 of the NAND gate, which do not have the MeasI property.

After all instances have been processed, from step 708, the procedure continues to step 728 to execute a further procedure "MSfn1Footer" of the formatter 550 to print the information contained in the Supply list 556 to the netlist file. In the example, a supply "vinv0__1" is declared for instance GI0 of "inv" as being connected between "artificial" net inv0__1 and net 1 (vcc!), with the supply providing zero volts, as is represented by the four terms listed in line 4.64 of the netlist 402 (FIG. 4B). Similarly, line 4.65 declares a supply "vinv0__1" for instance GI1 of "inv", the supply being connected between "artificial" net inv1__1 and net 1 (vcc!), with the supply providing zero volts, as is represented by the four terms listed in line 4.65 of the netlist 402 (FIG. 4B). An example of a segment of code for the procedure for adding the information contained in the Supply list 556 to the netlist file is shown in FIG. 8B, lines 39–53. When the supply information has been added to the netlist file, the procedure is done.

In the exemplary embodiment, different property names were applied to the two instances GI0 and GI1 of "inv" and uniquely identified "artificial" nets were created for each of the instances. However, it is possible to apply the same property name to different instances, and/or to instances at different levels of hierarchy. Applying the same property name to both instances of "inv" results in the current through both instances of "inv" to be added together during simulation. Stated in another way, the supply is merged to a combination of nets which can be nets in the same instance or in different instances. Moreover, the property can be assigned to instances at a level of the hierarchy above the level at which the instances are defined.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

I claim:

1. A method for creating a netlist file that allows current measurement through a subcircuit comprising:

obtaining a schematic data file having a plurality of instances and a plurality of nets, the plurality of nets having at least a first net and a second net;

assigning property means to one instance of the plurality of instances, the property means operable for identifying the first net through which current flow is to be measured and a supply to be connected and for identifying the future location of a uniquely identified artificial net to be substituted later for the first net;

creating the netlist file by traversing a hierarchy of the schematic data file to locate each instance of the plurality of instances in sequence;

checking each instance of the plurality of instances located to determine if the instance located has the property means;

creating the uniquely identified artificial net in the netlist file for the first net that is identified by the property means; and substituting the uniquely identified artificial net for the identified net of the one instance in the netlist file at the time that the netlist file is being created.

2. The method according to claim 1, including extracting from the property means the identity of a supply to be connected between the uniquely identified artificial net and the identified net of the one instance, and declaring the supply as being connected between the uniquely identified artificial net and the identified net.

3. The method according to claim 1, wherein one of the plurality of instances includes the second net through which current flow is to be measured, the one of the plurality of instances having property means assigned thereto for identifying the second net and a supply to be connected to the second identified net of the one of the plurality of instances; and including creating a second uniquely identified artificial net, and substituting the second uniquely identified artificial net for the second identified net at the time that the netlist file is being created.

4. The method according to claim 3, including associating in a data structure the net names of the uniquely identified artificial nets with the net names of the identified nets for each instance having property means assigned thereto.

5. The method according to claim 4, wherein associating the uniquely identified artificial net for the one identified net comprises the steps of extracting a net name from the property means; creating an artificial net number for the extracted net name; and substituting the artificial net number created for the identified net number in the netlist file.

6. The method according to claim 1, wherein the identified net is a power supply net for connecting a voltage source to the one instance.

7. The method according to claim 3, wherein the first and second nets are nets of first and second instances, and including assigning the same property means to the first and second instances.

8. The method according to claim 1, wherein a design schematic represented in the schematic data file includes a plurality of levels of hierarchy, and wherein the uniquely identified artificial net in the netlist file is globally available to all of the levels of the hierarchy of the design schematic as represented in the netlist file.

9. A system for creating a netlist file that allows current measurement through a subcircuit comprising:

an interface for obtaining a schematic data file having a plurality of instances and a plurality of nets, the plurality of nets having at least a first net and a second net;

an input mechanism for assigning property means to one instance of the plurality of instances, the property means operable for identifying the first net through which current flow is to be measured and a supply to be connected and for identifying the future location of a uniquely identified artificial net to be substituted later for the first net;

a traversal engine for creating the netlist file, wherein the traversal engine performs the steps of:

traversing a hierarchy of the schematic data file to locate each instance of the plurality of instances in sequence;

checking each instance of the plurality of instances located to determine if the instance located has the property means;

evaluating the property means for at least the one instance;

creating the uniquely identified artificial net in the netlist file for the first net that is identified by the property means; and substituting the uniquely identified artificial net for the identified net of the one instance at the time that the netlist file is being created.

10. The system according to claim 9, wherein the traversal engine performs the additional steps of extracting from the property means the identity of a supply to be connected between the uniquely identified artificial net and the identified net of the one instance, and declaring the supply connected between the uniquely identified artificial net and the identified net.

11. The system according to claim 9, wherein one of the plurality of instances includes the second net through which current flow is to be measured, the one of the instances having property means assigned thereto for identifying the second net and a supply to be connected to the identified second net; and wherein the traversal engine performs the additional steps of:

creating a second uniquely identified artificial net; and substituting the second uniquely identified artificial net for the second identified net at the time that the netlist file is being created.

12. The system according to claim 11, including a data structure associating the net names of the uniquely identified artificial nets with the net names of the identified nets for each instance having property means assigned thereto.

13. The system according to claim 12, wherein the traversal engine performs the additional steps of:

extracting a net name from the property means;

creating an artificial net number for the extracted net name; and substituting the artificial net number created for the identified net number in the netlist file.

14. The system according to claim 8, wherein a design schematic represented in the schematic data file includes a plurality of levels of hierarchy, and wherein the artificial net in the netlist file is globally available to all of the levels of the hierarchy of the design schematic as represented in the netlist.

15. The system according to claim 11, wherein the first and second nets are nets of first and second instances, and wherein the traversal engine performs the additional step of assigning the same property means to the first and second instances.

16. The system according to claim 9, wherein a design schematic represented in the schematic data file includes a plurality of levels of hierarchy, and wherein the uniquely identified artificial net in the netlist file is globally available to all of the levels of the hierarchy of the design schematic as represented in the netlist file.

17. A computer program product comprising a computer usable medium having a computer readable program code means embodied therein for causing a netlist file to be created that allows current measurement through a subcircuit, the computer program product comprising:

computer readable program code means for obtaining a schematic data file having plurality of instances and a plurality of nets, the plurality of nets having at least a first net and a second net;

computer readable program code means for assigning property means to one instance of the plurality of instances, the property means operable for identifying the first net through which current flow is to be measured and a supply to be connected and for identifying the future location of a uniquely identified artificial net to be substituted later for the first net;

computer readable program code means for creating the netlist file by traversing a hierarchy of the schematic data file to locate each instance of the plurality of instances in sequence;

computer readable program code means for checking each instance of the plurality of instances located to determine if the instance located has the property means;

computer readable program code means for creating a uniquely identified artificial net in the netlist file for the first net that is identified by the property means; and computer readable program code means for substituting the uniquely identified artificial net for the identified net of the one instance in the netlist file at the time that the netlist file is being created.

18. The computer program product according to claim 17, including computer readable program code means for extracting from the property means the identity of a supply to be connected between the uniquely identified artificial net and the identified net of the one instance, and computer readable program code means for declaring the supply as being connected between the uniquely identified artificial net and the identified net.

19. The computer program product according to claim 17, wherein one of the plurality of instances includes a second net through which current flow is to be measured, the one of the plurality of instances having property means assigned thereto for identifying the second net and a supply to be connected to the second identified net; and including computer readable program code means for creating a second uniquely identified artificial net, and computer readable program code means for substituting the second uniquely identified artificial net for the second identified net at the time that the netlist file is being created.

20. The computer program product according to claim 19, including computer readable program code means for associating in a data structure the net names of the uniquely identified artificial nets with the net names of the identified nets for each instance having property means assigned thereto.

21. The computer program product according to claim 20, including computer readable program code means for extracting a net name from the property means, computer readable program code means for creating an artificial net number for the extracted net name; and computer readable program code means for substituting the artificial net number created for the identified net number in the netlist file.

22. The computer program product according to claim 19, wherein the first and second nets are nets of first and second instances, and including computer readable program code means for assigning the same property means to the first and second instances.

* * * * *